United States Patent
Tourigny

[19]

[11] Patent Number: 5,991,963
[45] Date of Patent: Nov. 30, 1999

[54] SUPPLY ROLL MEMBER, SHEET MATERIAL DISPENSER APPARATUS, AND STENCIL WIPING ASSEMBLY INCLUDING THE SAME

[75] Inventor: Jay S. Tourigny, Collinsville, Conn.

[73] Assignee: Micro Care Corporation, Bristol, Conn.

[21] Appl. No.: 08/798,980

[22] Filed: Feb. 11, 1997

[51] Int. Cl.[6] .............................. B41L 41/00; B08B 11/00; B65H 75/18

[52] U.S. Cl. ........................... 15/246; 15/102; 242/596.7; 242/591; 242/599.3; 242/599.4; 101/423

[58] Field of Search ......................... 15/97.1, 102, 256.5, 15/246; 242/591, 596, 596.7, 599.3, 599.4; 101/423, 424

[56] References Cited

U.S. PATENT DOCUMENTS

| | | |
|---|---|---|
| 600,333 | 3/1898 | Meeker . |
| 822,280 | 6/1906 | Kelly . |
| 888,395 | 5/1908 | Freborg . |
| 1,961,176 | 6/1934 | Smith . |
| 2,127,772 | 8/1938 | Horn et al. . |
| 2,705,112 | 3/1955 | Baumgartner . |
| 2,743,883 | 5/1956 | Farmer . |
| 3,524,369 | 8/1970 | Hoffman . |
| 3,598,332 | 8/1971 | Sharkey . |
| 3,650,493 | 3/1972 | Gottily . |
| 4,264,042 | 4/1981 | Annoni et al. . |
| 4,911,074 | 3/1990 | Simila . |
| 4,946,113 | 8/1990 | Riffle et al. . |
| 8,136,072 | 2/1906 | Wood . |

FOREIGN PATENT DOCUMENTS

| | | |
|---|---|---|
| 0 360 400 A2 | 3/1990 | European Pat. Off. . |
| 0 628 410 A1 | 12/1994 | European Pat. Off. . |
| 0 747 218 A2 | 12/1996 | European Pat. Off. . |

Primary Examiner—Randall E. Chin
Attorney, Agent, or Firm—Law Office of Victor E. Libert; Victor E. Libert; Roger C. Phillips

[57] ABSTRACT

A dispenser apparatus (36) permits dispensing from different model machines sheet material from a standard size supply roll (40), mounted as part of a supply roll member (38) on a support bar (46) having a locator (48a, 48b) which adapts the dispenser apparatus (36) to be mounted on any one of a variety of models of under-stencil wipe fixtures (26). Support bar (46) has a plurality of radial bores (52a–52d) to enable positioning supply roll member (38) at a selected longitudinal position in support bar (46) to permit aligning the supply roll (40) with a given cut-out pattern (18) on stencil (16). Supply roll member (38) comprises a supply roll (40) mounted on a core member (42) having a core member extension (42a) which protrudes beyond supply roll (40) and has a radial bore (42b) for mounting supply roll member (38) on support bar (46) by screw fastener(54).

10 Claims, 3 Drawing Sheets

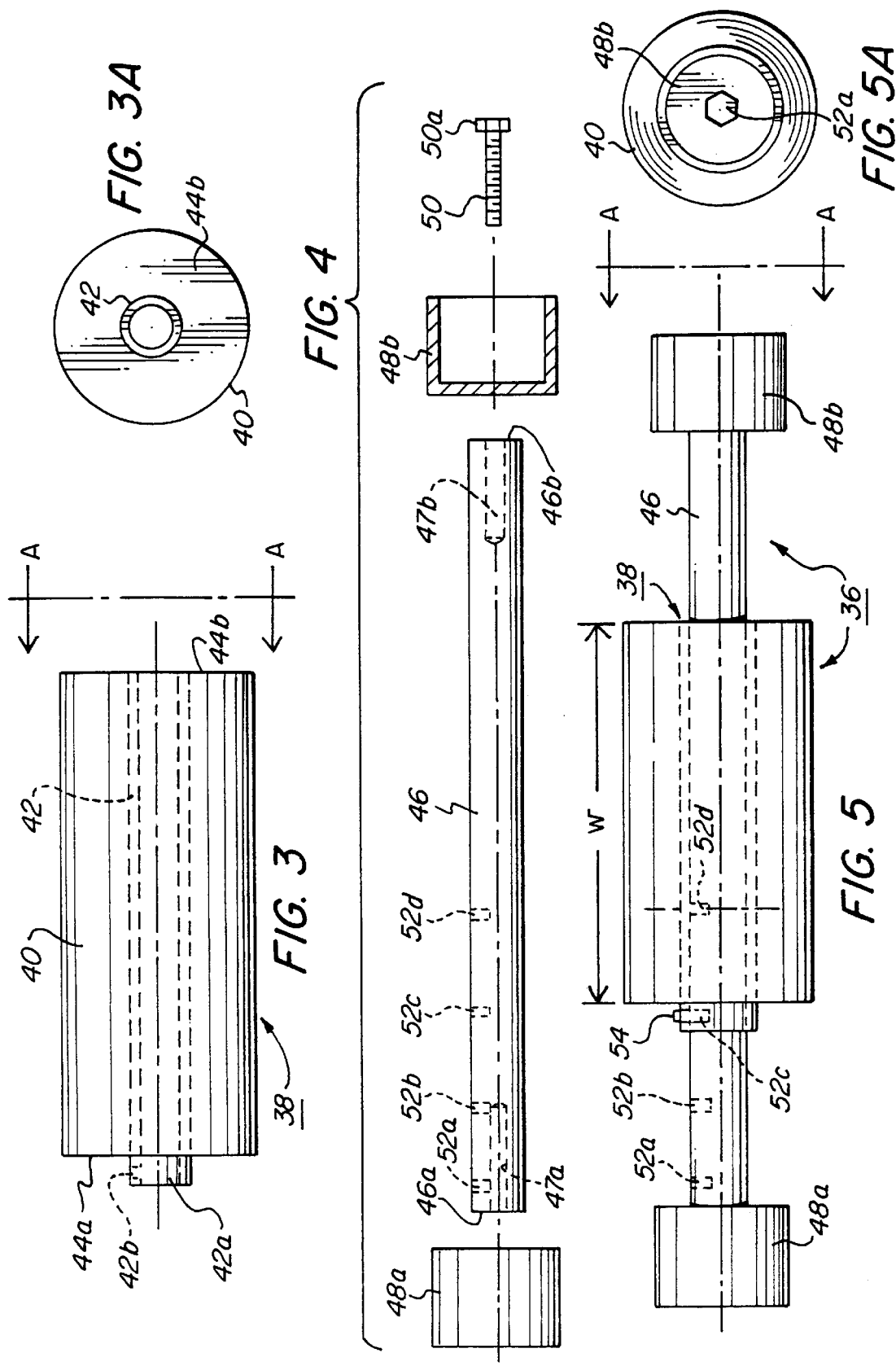

SUPPLY ROLL MEMBER, SHEET MATERIAL DISPENSER APPARATUS, AND STENCIL WIPING ASSEMBLY INCLUDING THE SAME

BACKGROUND OF THE INVENTION

1. Field of the Invention

The present invention concerns apparatus for dispensing a sheet material and specifically to apparatus for automatically unwinding a sheet material in predetermined amounts at predetermined intervals. More specifically, the present invention concerns apparatus for dispensing sheet cleaning materials for cleaning solder paste stencils while the stencils are in use with a solder paste screen printer.

2. Background

The electronics industry has long made use of solder paste to hold surface mount and chip electronic components in relative orientation to lands on their respective printed circuit boards ("PCBs") prior to actually soldering the components in place. Solder paste screen printers apply solder paste to a printed circuit board ("PCB") in a predetermined pattern by utilizing a stencil having cutouts that replicate the land pattern of a PCB. During operation, the bottoms and cut-outs of such stencils become contaminated with solder paste and thus must periodically be cleaned. It is well known to equip solder paste screen printers with under-stencil wipe fixtures having thereon a roll of wiping material. The under-stencil wipe fixture is periodically traversed along the bottom side of the stencil to remove solder paste therefrom. The used wiping material is then advanced from a dispenser roll onto a take-up roll to expose a fresh, clean segment of wiping material prior to the next periodic pass. Such fixtures are typically configured with a full-width roll of wiping material, that is, the width of the wiping material is equal to that of the maximum width of the stencil which can be accommodated on a particular solder paste screen printer. Therefore, in situations in which the land pattern of the particular PCBs being printed is narrower than the maximum stencil width, a situation which occurs very frequently, a substantial amount of wiping material is wasted because it is used to wipe an unused segment or segments of the stencil. In addition to the waste of wiping material, because solder paste is considered to be hazardous, it is subject to onerous safe disposal requirements. That portion of the wiping material which is uncontaminated nonetheless adds to the bulk of the contaminated material and therefore needlessly increases disposal costs.

Related Art

U.S. Pat. No. 2,705,112 to Baumgartner, issued Mar. 29, 1955, discloses mounting material-dispensing rolls of varying widths onto a shaft at different longitudinal positions relative to one end thereof (column 1, lines 35 through 41). Specifically, Baumgartner discloses a stock roll supply arbor comprising a pair of removable core plugs that are dimensioned and configured to mate with the inner cylindrical core of the supply roll, one at each end thereof, to mount the supply roll onto a shaft. The shaft has a plurality of holes disposed along the length thereof and a pin is used to secure one of the core plugs to a selected one of the holes in the shaft.

U.S. Pat. No. 3,598,332 to Sharkey, issued Aug. 10, 1971, discloses a web supporting roller assembly comprising two removable end flanges (5) that are attached by screw means (7) to a tube (11) on which a roll of material is mounted, such that the edges of the material contact the inner lip of the flange at each end thereof.

SUMMARY OF THE INVENTION

Generally, in accordance with the present invention there is provided a supply roll member comprising a core member about which a length of sheet material is wound. The core member extends beyond at least one of the sides of the roll of material to provide a core member extension having a roll-mounting means thereon. The present invention also provides an apparatus for dispensing a sheet material from fixtures having thereon a support means for receiving the apparatus. The apparatus includes a supply roll member of lesser width than a support bar, the supply roll member comprising a web of sheet material wound about a core member having roll-mounting means thereon and dimensioned and configured to be mounted at any one of selected longitudinal positions on the support bar and secured in such position by the roll-mounting means. In this way, supply rolls of various widths may be selectively positioned on the support bar so as to dispense the sheet material along a path of selected width extending perpendicularly of a selected segment of the length of the support bar.

Specifically, in accordance with the present invention there is provided a dispenser apparatus for dispensing a sheet material from fixtures having support means for receiving the dispenser apparatus thereon, the dispenser apparatus comprising the following components. A supply roll has opposite sides and a given width and comprises a web of sheet material wound on a core member which has roll-mounting means thereon. The sheet material is wound on the core member in a manner to permit unwinding of the sheet material therefrom to supply lengths thereof on demand. A support bar has opposite ends and a length greater than the width of the supply roll and is otherwise dimensioned and configured to receive the core member for mounting of the supply roll on the support bar at a selected longitudinal position thereon. The core member is secured to the support bar by the roll-mounting means.

In accordance with one aspect of the present invention, the support bar has thereon a plurality of positioning means, such as bores drilled into the bar transversely of the longitudinal axis thereof, such positioning means being dimensioned and configured to have the roll-mounting means engaged therewith by suitable fastener means, e.g., by a set screw, thereby positioning the supply roll at a selected longitudinal position on the support bar.

Another aspect of the present invention provides for the positioning means on the support bar to comprise a first formation extending longitudinally along the support bar, and the roll mounting means to comprise a second formation carried on the core member, with the first and second formations being respectively dimensioned and configured to engage each other to selectively position the core member at a selected longitudinal position on the support bar.

Yet another aspect of the present invention provides for the first formation to comprise a plurality of first sub-formations formed at respective longitudinally spaced-apart locations on the support bar, and the second formation to comprise at least one second sub-formation comprising means to secure the second sub-formation to any selected one of the first sub-formations. For example, in a specific embodiment of this aspect of the present invention, the first sub-formations may comprise radial bores and the second sub-formation may comprise at least one radial mounting bore extending through at least a portion of the core member, and a screw-like member received within the radial mounting bore and extending into a selected one of the radial bores.

In accordance with yet another aspect of the present invention, the core member extends beyond the roll on at least one of the sides thereof, to provide at least one core member extension and the roll-mounting means is on the core member extension.

Yet another aspect of the present invention provides for the core member to comprise, at least in the portion thereof containing the roll-mounting means, or at least the core extension thereof, a transparent material, whereby to facilitate aligning of the roll-mounting means with the positioning means on the support bar.

Yet another aspect of the present invention provides for the support bar to be dimensioned and configured to receive thereon, at the ends thereof, locator means whereby the support bar may be fitted with a selected model of a plurality of locator means models which are differently configured one from the other. This enables the support bar, when the locator means are mounted thereon, to be mounted on a selected one of a plurality of different models of the fixtures on which the dispenser apparatus is carried.

Another aspect of the invention provides for the length of the support bar to be sufficiently greater than the width of the supply roll to permit positioning the supply roll at any one of a plurality of longitudinal positions on the support bar.

The present invention also provides for a stencil wiping assembly comprising the following components. An under-stencil wipe fixture is dimensioned and configured to be operatively connected to a solder paste screen printer having a printing stencil, the fixture being capable of moving relative to such stencil, for example, of indexing both transversely and parallel relative to such stencil, to bring a sheet material, described below, into wiping contact with the stencil. The fixture comprises support means for receiving thereon a sheet material dispenser apparatus, and a used sheet material take-up roll. The take-up roll may be dimensioned and configured to accommodate a particular sheet material dispenser apparatus, as described below. A sheet material dispenser apparatus is carried on the fixture for wiping the stencil with the sheet material by moving the fixture relative to the stencil. The sheet material dispenser apparatus comprises the following components. A supply roll has opposite sides and a given width and comprises a web of sheet material wound on a core member, the core member having roll-mounting means thereon. A support bar has a length sufficiently greater than the width of the supply roll whereby the supply roll may be positioned at a selected one of a plurality of longitudinally positions along the support bar and be held in place thereon by the roll-mounting means.

The present invention in one aspect thereof also provides a supply roll member comprising a length of sheet material wound on a core member to provide a supply roll of the sheet material having opposite sides wherein the core member has a first end and an opposite second end and extends beyond at least one of the sides of the supply roll to provide at least one core member extension having a roll-mounting means thereon.

As used herein and in the claims, the term "supply roll" means a roll of a web of sheet material, such as paper or the like, which may readily be unrolled to play out a length of the material. The usual configuration of a "supply roll" is a continuous web of material rolled up in a direction perpendicular to the longitudinal axis of the web to provide a roll with flat sides.

Other aspects of the present invention will be apparent from the following description and drawings.

BRIEF DESCRIPTION OF THE DRAWINGS

FIG. 3 is a side view of a supply roll member in accordance with one embodiment of the present invention;

FIG. 3A is an end view, taken along line A—A of FIG. 3;

FIG. 4 is an exploded, schematic view, partly in cross section, of a support bar and associated locator means to be affixed to the ends thereof in accordance with one embodiment of the present invention;

FIG. 5 is a side view of a dispenser apparatus in accordance with one embodiment of the present invention comprising the supply roll member of FIG. 3 mounted on the support bar of FIG. 4; and FIG. 5A is an end view taken along line A—A of FIG. 5.

DETAILED DESCRIPTION OF THE INVENTION AND PREFERRED EMBODIMENTS THEREOF

Figure 1:
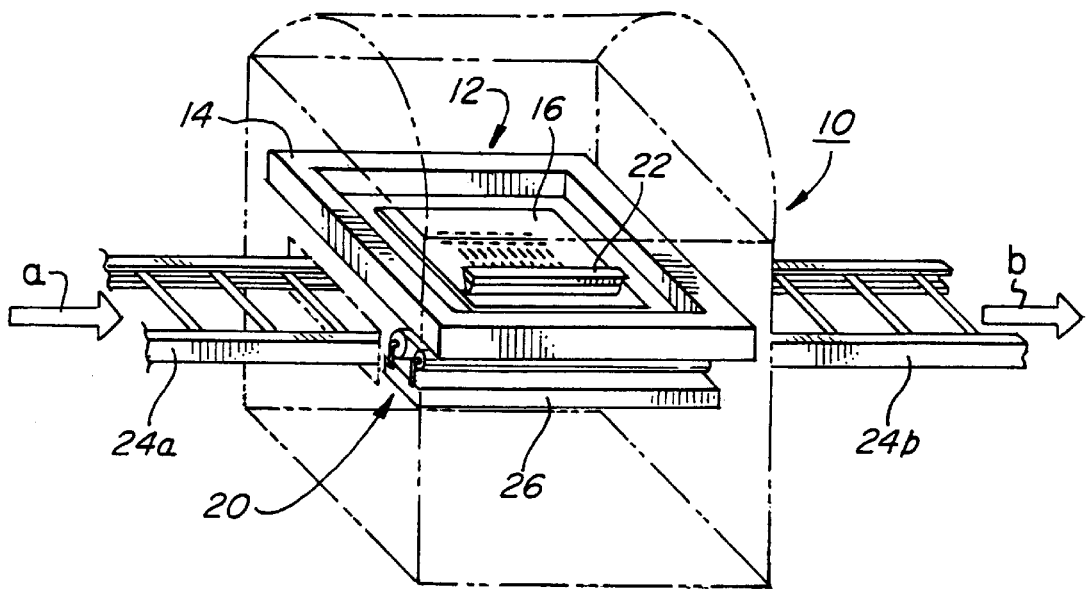
FIG. 1 is a schematic perspective view showing a stencil wiping assembly in accordance with one embodiment of the present invention mounted beneath the stencil frame assembly of a solder paste screen printer, the remainder of which is shown in phantom outline for clarity of illustration.

FIG. 1 shows in schematic perspective view a solder paste screen printer 10, the bulk of which is shown in phantom outline in order to clearly show a stencil frame assembly 12, a stencil wiping assembly 20, and a squeegee 22, each forming part of solder paste screen printer 10. Referring to FIGS. 1, 2A, 2B and 2C, stencil frame assembly 12 comprises a rectangular, e.g., square, frame 14 within which is mounted a stencil 16 which has formed therein (FIG. 2C) a plurality of cut-outs disposed in a cut-out pattern 18. Cut-out pattern 18 defines a series of lands which are to be printed in solder paste on PCBs processed through the solder paste screen printer. Solder paste screen printer 10 has a paste applicator (not shown) which applies a solder paste over the cut-out pattern 18 of stencil 16 in the known manner and further comprises a squeegee 22 which smoothes the applied solder paste over cut-out pattern 18 and forces the paste through the cut-outs thereof and onto the PCBs (not shown) being processed by solder paste screen printer 10. FIG. 1 shows a conveyor means having an inlet conveyer section 24*a* for transporting the PCBs to be printed into solder paste screen printer 10 in the direction of arrow "a" and an outlet conveyor section 24*b* for transporting the printed PCBs from solder paste screen printer 10 in the direction of arrow "b".

Beneath stencil frame assembly 12 there is positioned a stencil wiping assembly 20 which is comprised of an under-stencil wipe fixture 26 comprised of, in the illustrated embodiment, a base member 28 (best seen in FIGS. 2D and 2E) having mounted thereon support means 30*a*, 30*b* for receiving thereon a sheet material dispenser apparatus of the type shown at 36 in FIG. 5, as more fully described below. Support means 30*a*, 30*b* have respective locator mounts 31*a*, 31*b* formed thereon and dimensioned and configured to have mounted thereon the locator means of the sheet material dispenser apparatus, as described below.

Under-stencil wipe fixture 26 further comprises a take-up roll 32 mounted on supports 34*a*, 34*b*. Take-up roll 32 may be driven (by means not shown) in order to provide periodic web advancement of the wiping material. Arrow 35 in FIG. 2D schematically illustrates the effect of retention means (not shown) for supporting a section 40*a* of sheet material dispensed from supply roll 40 so that a segment of section 40*a* traverses the path P en route to take-up roll 32, on which the used sheet material forms a used material roll 40*b*. Disposition of section 40*a* of the sheet material along path P holds it in cleaning contact with the underside of a stencil screen to be cleaned. The retention means whose effect is indicated by arrow 35 may be any suitable means known in the art, such as vacuum fixtures (not shown) disposed below and in contact with section 40*a* of the sheet material, along path P, or an adjustable support roller or bar (not shown) positioned at the location of arrow 35. In either case, the section 40*a* of the sheet material along path P is maintained in cleaning contact with the stencil screen to be cleaned. During the cleaning of the stencil screen, the sheet material may be held stationary relative to supply roll 40 or may be continuously or intermittently unrolled therefrom. After the cleaning pass is completed, a length of sheet material is unrolled to present a clean section 40*a* of sheet material, at least along path P, for the next cycle.

Take-up roll 32 may be replaced in a given case by one which is specifically sized to accommodate a particular width of supply roll 40. Thus, a shorter (narrower) take-up core or roll (not shown) may be substituted for take-up roll 32. A support bar and take-up core arrangement similar to the support bar and supply roll arrangement of FIG. 5 is conventionally employed to take up the used wiping material.

Referring now to FIG. 3, there is shown a supply roll member 38 comprising a supply roll 40 of a web of sheet material wound on a tubular core member 42. Supply roll 40 comprises a substantially cylindrical roll having opposite sides 44*a*, 44*b* and core member 42 extends throughout the length of supply roll 40 and extends beyond side 44*a* thereof to expose a core member extension 42*a* having thereon roll-mounting means which, in the illustrated embodiment, comprises a radial bore 42*b* extending through the wall of tubular core member 42 or, more precisely, in the core member extension 42*a* thereof.

FIG. 4 shows in an exploded view a support bar 46 in accordance with one embodiment of the present invention having a pair of threaded bores 47*a*, 47*b*, bore 47*a* being formed at end 46*a* and bore 47*b* at end 46*b*. Both threaded bores 47*a*, 47*b* are coaxial with support bar 46. Locator means 48*a*, 48*b* are mounted, one each on the opposite respective ends 46*a*, 46*b* of support bar 46 by bolts 50, only one of which is shown in FIG. 4. Locator means 48*b* is shown in longitudinal cross section and is seen to be generally cup-shaped and is affixed to support bar 46 by bolt 50 which is received within threaded bore 47*b* formed at end 46*b* along the longitudinal axis of support bar 46. Bolt 50 has the usual head 50*a* so that, once threaded in place, locator means 48*b* is securely coaxially affixed to one end of support bar 46. Locator means 48*a* is identically affixed to the opposite end 46*a* of support bar 46.

A plurality of positioning means are spaced along a portion of the length of support bar 46 and comprise in the illustrated embodiment radial bores 52*a*, 52*b*, 52*c* and 52*d* formed in the surface of support bar 46. In the particular configuration of the illustrated embodiment, radial bores 52*a*–52*d* extend only part way into support bar 46 and do not extend all the way therethrough. Of course, any suitable first formation, i.e., positioning means, may be formed on the support bar and any suitable, complementary second formation, i.e., roll-mounting means, may be formed on the core member. For example, the positioning means may comprise a keyway formed in the support bar and the roll-mounting means may comprise a spline-like member carried on the core member and fastenable within the keyway. Any other suitable fastening arrangement may be used.

In order to assemble sheet dispenser apparatus 36 as shown in FIG. 5, supply member 38 is passed over one end of support bar 46 and radial mounting bore 42*b* on core member extension 42*a* is aligned with a selected one of the radial bores 52*a*–52*d* to position supply roll member 38 at a selected longitudinal position on support bar 46. In order to facilitate aligning radial bore 42*b* with a selected one of the radial bores 52*a*–52*d*, core member 42, or at least core member extension 42*a* thereof, may be made of a transparent material, such as a transparent plastic material. The position selected, and the width of the supply roll member selected, will depend on the particular cut-out pattern 18 of the stencil 16 being used on the solder paste screen printer 10 which is to be serviced by the stencil wiping assembly 20. In the case illustrated in FIG. 5, radial bore 42*b* of core member extension 42*a* is aligned with radial bore 52*c*. A fastener member such as set screw 54 is then threaded through radial bore 42*b* and into radial bore 52*c* to securely affix supply roll member 38 at a selected longitudinal position along support bar 46. Supply roll member 38 is also thereby constrained to rotate with support bar 46. Locator means 48a and 48*b* are then affixed to the respective opposite ends 46*a*, 46*b* of support bar 46. Locator means 48*a* and 48*b* are selected to fit on the locator mounts 31*a*, 31*b* of support means 30*a*, 30*b* respectively. A variety of different locator means may be provided in order to adapt support bar 46 for being mounted to any one of a number of different models of solder paste screen printers, more specifically, to the under-stencil wipe fixtures thereof. In this way a support bar of standard outside diameter may be employed, by choosing the appropriate locator means, with a variety of different solder paste screen printers. Although the length of the support bar may vary to accommodate different machines, the provisions of a standard outside diameter of the support bar for use with any model machine allows for use of a standard core diameter wiping material roll. This eliminates the need for suppliers and operators to maintain an inventory of different core inside diameters of wiping material rolls for different solder paste screen printers or other such machines. For example, the present invention provides the advantage that suppliers need keep in stock wiping material rolls of only a single size of inside diameter core, and slit it to the width required by the customer for a particular job Naturally, different machines will have different size shaft diameters for mounting the wiping material rolls. Accordingly, different sets of locator means 48*a*, 48*b* may be dimensioned and configured to be mountable on different models of solder paste sheet printers. For example, some commercially available solder paste printer machines accommodate a ¾ inch diameter roll shaft and others a 1 ½ inch diameter roll shaft. By affixing either a ¾ inch diameter or 1 ½ inch diameter set of appropriately configured locator means 48*a*, 48*b* to support bar 46, dispensing apparatus 36

(FIG. 5) may be mounted on either the ¾ inch or 1 ½ inch shaft diameter machines. Supply bar 46 thus serves to mount supply roll member 38 for rotation thereon and incremental delivery of lengths of the web of sheet material from roll 40 to take-up roll 32. Such incremental delivery of the sheet material is controlled by automatic or manual drive means (not shown) which are well known to those skilled in the art. Means to secure locator means 48*a*, 48*b* on locator mounts 31*a*, 31*b* are not shown in the schematic illustrations of FIGS. 2D and 2E but are well known to those skilled in the art.

It will be appreciated from FIG. 5, that support bar 46 is capable of receiving supply roll members 38 having supply rolls 40 of different widths w and of receiving them at different selected longitudinal positions along support bar 46, depending upon which of radial bores 52*a*–52*d* is selected for alignment with radial bore 42*b* of core member extension 42*a*. As indicated above, if desired, a take-up roll 32 sized to accommodate a specific size of supply roll 40 may be mounted on supports 34*a*, 34*b*.

Figures 2A, 2B:
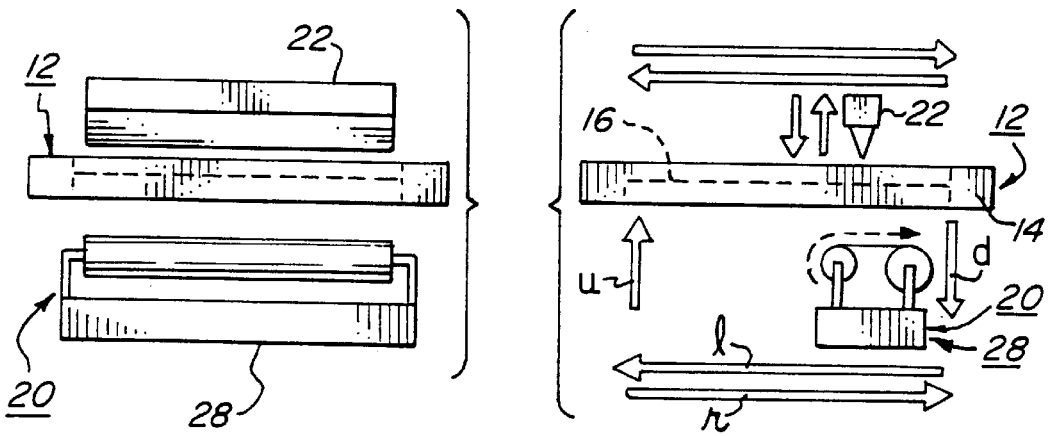
FIG. 2A is a schematic, exploded end elevation view of the stencil wiping assembly and stencil frame assembly of FIG. 1.
FIG. 2B is a schematic, exploded side elevation view of the stencil wiping assembly and stencil frame assembly of FIG. 1.
Figure 2C:
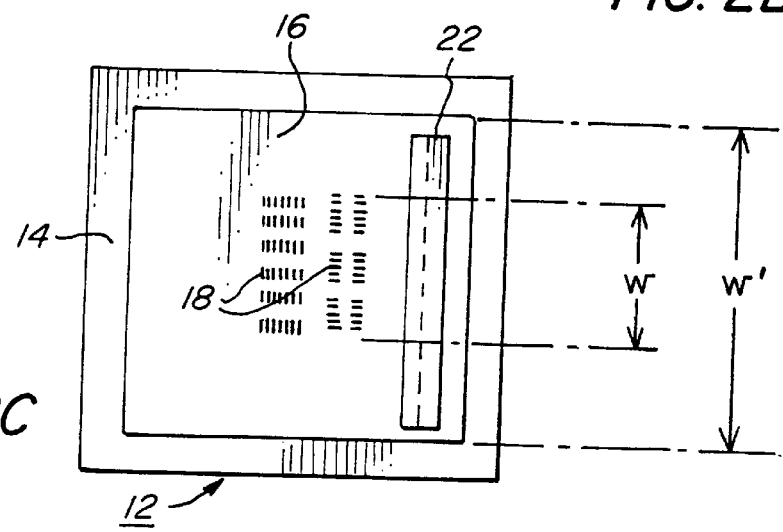
FIG. 2C is a schematic top plan view of the stencil frame assembly of FIG. 1.
Figure 2D:
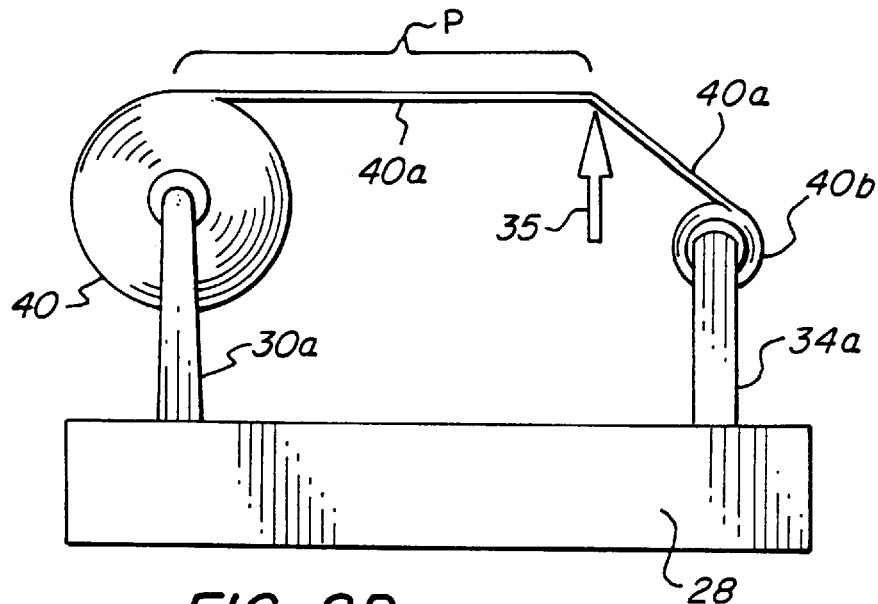
FIG. 2D is a schematic side elevation view of an under-stencil wipe fixture of a type on which the dispenser apparatus of the present invention may be mounted to provide the stencil wiping apparatus of the present invention.
Figure 2E:
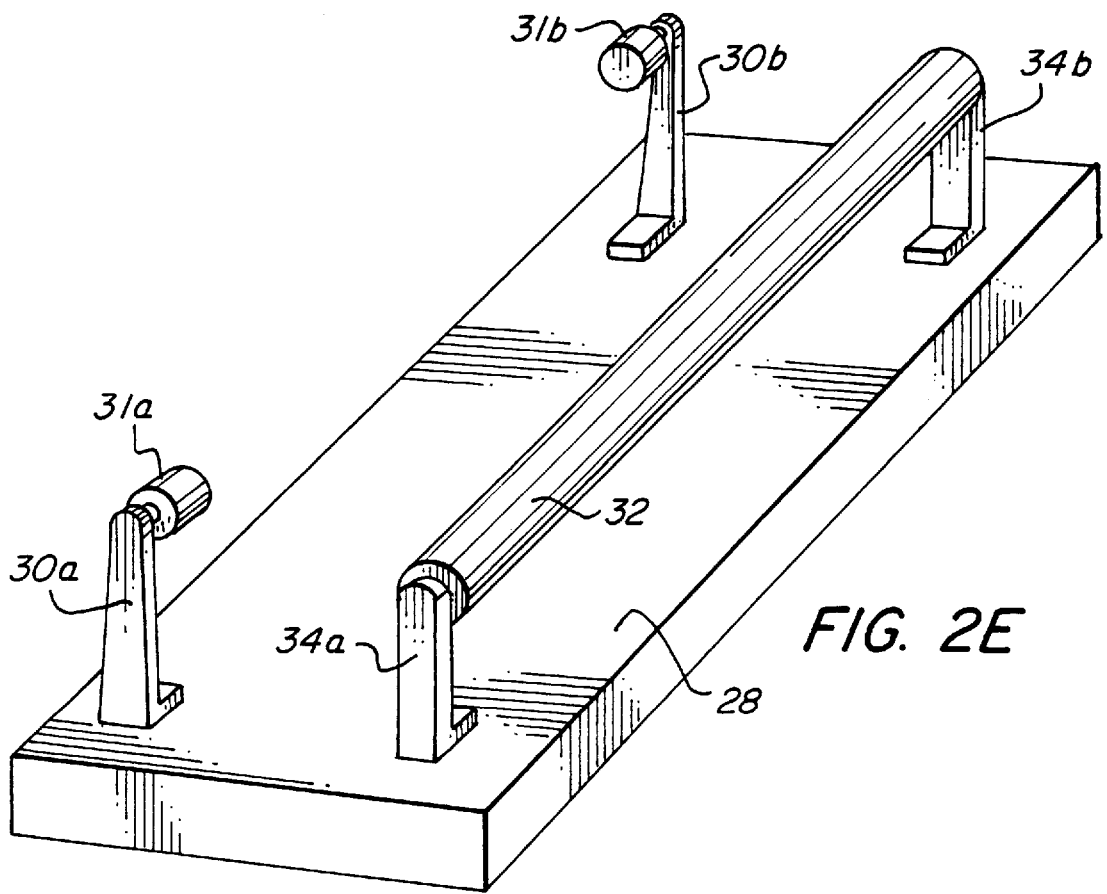
FIG. 2E is a perspective view of the under-stencil wipe fixture of FIG. 2D.

Referring to FIG. 2C, it will be seen that the width w of roll 40 and its longitudinal position along support bar 46 will be selected so as to enable the sheet material of roll 40 to cover the width of cut-out pattern 18, as shown by the dimension w in FIG. 2C. In this manner, the portion of the stencil through which the solder paste is forced can be cleaned by sheet material dispensed from roll 40 of supply roll member 38 without necessity of providing a roll of material wide enough to cover the entire stencil, as indicated by the dimension lines w' in FIG. 2C, and as is the case with prior art devices. A roll 40 of sheet material wide enough to cover the entire width of stencil 16 would be used only in those cases in which the cut-out pattern 18 extended for the entire width of stencil 16. If a cut-out pattern is offset from the position of cut-out pattern 18 illustrated in FIG. 2C, supply roll member 38 would be positioned at an appropriate different longitudinal position along support bar 46 to accommodate the offset position (relative to cut-out pattern 18) of the pattern involved by selecting a different one of radial bores 52*a*–52*d* to secure core member extension 42*a* thereto.

In operation, PCBs to be printed may be conveyed along inlet conveyor section 24*a*, positioned beneath stencil 16 while solder paste is applied to the top of stencil 16 and forced through the cut-outs of cut-out pattern 18 by squeegee 22. With such printing operation completed, the printed PCB may be conveyed from under stencil 16 by a segment of the conveyor belt (not visible in FIG. 1) then to section 24*b* for removal from solder paste screen printer 10. It will be appreciated that, alternatively, the PCBs could be manually supplied to, and removed from, solder paste screen printer 10. Periodically, the underside of stencil 16 is wiped clean of solder paste which may be streaked or otherwise deposited thereon or lodged in the cut-outs. The cleaning is accomplished by traversing under-stencil wipe fixture 26 into contact with the underside of stencil 16 at one end thereof, traversing it along the length of the underside of stencil 16. During or prior to traversal along the length of the stencil, a section 40*a* of the sheet material of roll 40 is deployed from supply roll member 38 to take-up roll 32 and is constrained by suitable means such as a squeegee blade to contact the underside of stencil 16 in order to wipe it clean of solder paste. A vacuum may be applied through the squeegee blade to pull solder from the cut-outs and deposit it on the wiping material. This is attained by positioning stencil wiping assembly 20, as indicated by arrow "u" in FIG. 2B, to bring the section 40*a* of wiping material deployed from supply roll member 38 into contact with the left-hand side (as viewed in FIG. 2B) of the underside of stencil 16 and traversing it towards the right (as viewed in FIG. 2B) as indicated by arrow r to wipe clean the underside of the stencil 16. Under-stencil wipe fixture 26 is then indexed downwardly as indicated by the arrow d to bring the sheet material out of contact with the underside of stencil 16 (FIG. 2B) and traversed back to its starting point (the left-hand side as viewed in FIG. 2B) as indicated by arrow 1. During such rearward traversal, support bar 46 and take-up roller 32 are rotated so that the soiled portion of the sheet material of roll 40 is taken up on take-up roll 32 thereby exposing a clean section of material. In the meantime, one or more additional PCBs have been printed through the stencil 16 and under-stencil wipe fixture 26 is indexed upwardly as indicated by the arrows u in FIG. 2B to bring a clean segment of the material of roll 40 into contact with the underside of stencil 16 and the wiping process is repeated. The wiping process is carried out continuously as described in controlled cycles in order to maintain the underside of stencil 16 clean.

Although the present invention has been described in detail with respect to specific preferred embodiments thereof, it will be appreciated that various modifications thereto lie within the spirit and scope of the appended claims.

What is claimed is:

1. A dispenser apparatus for dispensing a sheet material from fixtures having support means for receiving the dispenser apparatus thereon, the dispenser apparatus comprising:

a supply roll having opposite sides and a given width and comprising a web of sheet material wound on a core member, the core member having roll-mounting means thereon and the sheet material being wound on the core member in a manner to permit unwinding of the sheet material therefrom to supply lengths thereof on demand; and a support bar having opposite ends and a length greater than the width of the supply roll and otherwise dimensioned and configured to receive the core member for mounting of the supply roll on the support bar at a selected one of a plurality of longitudinal positions thereon, with the core member secured to the support bar by the roll-mounting means;

wherein the support bar is dimensioned and configured to receive thereon at the ends thereof locator means, whereby the support bar may be fitted with a selected model of a plurality of locator means models differently configured one from the other to enable the support bar to be mounted on a selected one of a plurality of different models of such fixtures.

2. The apparatus of claim 1 wherein the support bar has thereon positioning means dimensioned and configured to have the roll-mounting means engaged therewith at any one of a plurality of longitudinally spaced-apart positions on the support bar, thereby enabling positioning of the supply roll at a selected longitudinal position on the support bar.

3. The apparatus of claim 2 wherein the positioning means on the support bar comprises a first formation extending longitudinally along the support bar, and the roll mounting means comprises a second formation carried on the core member, the first and second formations being respectively dimensioned and configured to engage each other to selectively position the core member at a selected longitudinal position on the support bar.

4. The apparatus of claim 3 wherein the first formation comprises a plurality of first sub-formations formed at respective longitudinally spaced-apart locations on the support bar, and the second formation comprises at least one second sub-formation comprising means to secure the second sub-formation to any selected one of the first sub-formations.

5. The apparatus of claim 4 wherein the first sub-formations comprise radial bores and the second sub-formation comprises at least one radial mounting bore extending through at least a portion of the core member and a screw-like member received within the radial mounting bore and extending into a selected one of the radial bores.

6. The apparatus of claim 2 wherein the core member is comprised, at least in the portion thereof containing the roll-mounting means, of a transparent material, whereby to facilitate aligning of the roll-mounting means with the positioning means on the support bar.

7. The apparatus of claim 1 wherein the core member extends beyond the roll on at least one of the sides thereof to provide at least one core member extension and the roll-mounting means is on the core member extension.

8. The apparatus of claim 7 wherein at least the core member extension of the core member is comprised of a transparent material.

9. The apparatus of claim 1 further comprising the locator means fitted on the support bar.

10. A dispenser apparatus for dispensing a sheet material from fixtures having support means for receiving the dispenser apparatus thereon, the dispenser apparatus comprising:

a supply roll having opposite sides and a given width and comprising a web of sheet material wound on a core member, the core member having roll-mounting means thereon and the sheet material being wound on the core member in a manner to permit unwinding of the sheet material therefrom to supply lengths thereof on demand; and a support bar having opposite ends and a length greater than the width of the supply roll and having thereon positioning means dimensioned and configured to have the roll-mounting means engaged therewith at any one of a plurality of longitudinally spaced-apart positions on the support bar, the positioning means comprising a first formation extending longitudinally along the support bar, and the roll-mounting means comprising a second formation carried on the core member, the first and second formations being respectively dimensioned and configured to engage each other to selectively position the core member at a selected longitudinal position on the support bar;

wherein the support bar is dimensioned and configured to receive thereon at the ends thereof locator means, whereby the support bar may be fitted with a selected model of a plurality of locator means models differently configured one from the other to enable the support bar to be mounted on a selected one of a plurality of different models of such fixtures.

* * * * *